(12) United States Patent
Ohshima

(10) Patent No.: US 10,061,558 B2
(45) Date of Patent: Aug. 28, 2018

(54) DATA PROCESSING DEVICE, DATA PROCESSING METHOD, AND COMPUTER PROGRAM

(71) Applicant: Semiconductor Energy Laboratory Co., Ltd., Atsugi-shi, Kanagawa-ken (JP)

(72) Inventor: Kazuaki Ohshima, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/446,045

(22) Filed: Mar. 1, 2017

(65) Prior Publication Data
US 2017/0177300 A1 Jun. 22, 2017

Related U.S. Application Data

(62) Division of application No. 14/200,433, filed on Mar. 7, 2014, now Pat. No. 9,612,795.

(30) Foreign Application Priority Data

Mar. 14, 2013 (JP) ................. 2013-051642

(51) Int. Cl.
| | |
|---|---|
| *G11C 19/00* | (2006.01) |
| *G11C 11/24* | (2006.01) |
| *H03K 3/037* | (2006.01) |
| *G06F 5/01* | (2006.01) |
| *H03K 3/356* | (2006.01) |

(Continued)

(52) U.S. Cl.
CPC ............... *G06F 5/01* (2013.01); *G06F 1/16* (2013.01); *G06F 5/015* (2013.01); *G11C 11/24* (2013.01); *G11C 19/00* (2013.01); *H03K 3/037* (2013.01); *H03K 3/356* (2013.01);
(Continued)

(58) Field of Classification Search
CPC ...... G06C 11/24; G06C 11/404; G06C 11/412
See application file for complete search history.

(56) References Cited

U.S. PATENT DOCUMENTS

| | | |
|---|---|---|
| 4,466,081 A | 8/1984 | Masuoka |
| 4,609,986 A | 9/1986 | Hartmann et al. |

(Continued)

FOREIGN PATENT DOCUMENTS

| | | |
|---|---|---|
| EP | 2466453 A | 6/2012 |
| JP | 04-241623 A | 8/1992 |

(Continued)

*Primary Examiner* — Chuong D Ngo
(74) *Attorney, Agent, or Firm* — Fish & Richardson P.C.

(57) ABSTRACT

A device for temporarily storing data output from a register or data obtained by processing the output data, a processing method therefor, a program, and the like is provided. A circuit (hereinafter, referred to as a selective memory cell) in which a plurality of switches and a signal storing circuit are connected is provided in a data processing device. The selective memory cell can selectively store necessary data. A result of a frequently performed process is stored in the selective memory cell. A process whose result is stored can be performed by only outputting the stored data instead of performing the whole process; thus, input data does not need to be transferred, which can result in a reduction in processing time.

7 Claims, 9 Drawing Sheets

(51) Int. Cl.
*G06F 1/16* (2006.01)
*H03K 19/00* (2006.01)
H03K 17/00 (2006.01)
H03K 17/04 (2006.01)

(52) U.S. Cl.
CPC ....... *H03K 19/0002* (2013.01); *H03K 17/002* (2013.01); *H03K 17/04* (2013.01)

(56) References Cited

U.S. PATENT DOCUMENTS

| | | |
|---|---|---|
| 4,642,487 A | 2/1987 | Carter |
| 4,870,302 A | 9/1989 | Freeman |
| 4,902,637 A | 2/1990 | Kondou et al. |
| 5,424,969 A | 6/1995 | Yamada et al. |
| 5,442,576 A | 8/1995 | Gergen et al. |
| 6,127,702 A | 10/2000 | Yamazaki et al. |
| 6,314,017 B1 | 11/2001 | Emori et al. |
| 6,781,865 B2 | 8/2004 | Ohtsuka et al. |
| 6,949,782 B2 | 9/2005 | Atwood et al. |
| 7,030,650 B1 | 4/2006 | Kaptanoglu et al. |
| 8,054,121 B2 | 11/2011 | Kato |
| 8,314,637 B2 | 11/2012 | Kato et al. |
| 8,339,828 B2 | 12/2012 | Yamazaki et al. |
| 8,339,836 B2 | 12/2012 | Yamazaki et al. |
| 8,787,084 B2 | 7/2014 | Ohmaru |
| 9,076,520 B2 | 7/2015 | Ohmaru |
| 9,612,795 B2 * | 4/2017 | Ohshima .................. G06F 5/01 |
| 2002/0096702 A1 | 7/2002 | Ishii et al. |
| 2005/0237786 A1 | 10/2005 | Atwood et al. |
| 2007/0047286 A1 | 3/2007 | Miki |
| 2008/0280058 A1 | 11/2008 | Krunks et al. |
| 2009/0114918 A1 | 5/2009 | Wang et al. |
| 2010/0148171 A1 | 6/2010 | Hayashi et al. |
| 2011/0089417 A1 | 4/2011 | Yamazaki et al. |
| 2011/0101332 A1 | 5/2011 | Yamazaki et al. |
| 2011/0101351 A1 | 5/2011 | Yamazaki |
| 2011/0114945 A1 | 5/2011 | Yamazaki et al. |
| 2011/0121878 A1 | 5/2011 | Kato et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |
| 2011/0156025 A1 | 6/2011 | Shionoiri et al. |
| 2011/0156027 A1 | 6/2011 | Yamazaki et al. |
| 2011/0156028 A1 | 6/2011 | Yamazaki et al. |
| 2011/0156117 A1 | 6/2011 | Yamazaki et al. |
| 2011/0157961 A1 | 6/2011 | Yamazaki et al. |
| 2011/0175083 A1 | 7/2011 | Sekine et al. |
| 2011/0175087 A1 | 7/2011 | Yamazaki et al. |
| 2011/0175104 A1 | 7/2011 | Yamazaki |
| 2011/0175646 A1 | 7/2011 | Takemura et al. |
| 2011/0176263 A1 | 7/2011 | Yamazaki et al. |
| 2011/0176348 A1 | 7/2011 | Yamazaki et al. |
| 2011/0176355 A1 | 7/2011 | Furutani et al. |
| 2011/0176377 A1 | 7/2011 | Koyama |
| 2011/0182110 A1 | 7/2011 | Yamazaki et al. |
| 2011/0186837 A1 | 8/2011 | Takahashi et al. |
| 2011/0187410 A1 | 8/2011 | Kato et al. |
| 2011/0194327 A1 | 8/2011 | Kawae |
| 2011/0194332 A1 | 8/2011 | Saito |
| 2012/0161220 A1 | 6/2012 | Yamazaki |
| 2012/0185859 A1 | 7/2012 | Kashiwaya et al. |
| 2012/0250397 A1 | 10/2012 | Ohmaru |
| 2012/0262982 A1 | 10/2012 | Takemura |
| 2012/0293200 A1 | 11/2012 | Takemura |
| 2012/0293201 A1 | 11/2012 | Fujita et al. |
| 2012/0293202 A1 | 11/2012 | Nishijima et al. |
| 2012/0293203 A1 | 11/2012 | Ohmaru et al. |
| 2012/0293206 A1 | 11/2012 | Yoneda et al. |
| 2012/0293242 A1 | 11/2012 | Kato |
| 2012/0306533 A1 | 12/2012 | Ohmaru |

FOREIGN PATENT DOCUMENTS

| | | |
|---|---|---|
| JP | 05-110392 A | 4/1993 |
| JP | 2011-039857 A | 2/2011 |
| JP | 2012-257200 A | 12/2012 |

* cited by examiner

DATA PROCESSING DEVICE, DATA PROCESSING METHOD, AND COMPUTER PROGRAM

CROSS-REFERENCE TO RELATED APPLICATIONS

This application is a divisional of U.S. application Ser. No. 14/200,433, filed Mar. 7, 2014, now allowed, which claims the benefit of a foreign priority application filed in Japan as Serial No. 2013-051642 on Mar. 14, 2013, both of which are incorporated by reference.

BACKGROUND OF THE INVENTION

1. Field of the Invention

This disclosure relates to a data processing device.

2. Description of the Related Art

A CPU, which is a typical data processing device, incorporates a storage device (e.g., register) and performs arithmetic processing using data, a command, or the like stored in the storage device, in many cases. An arithmetic result is stored in the storage device (see Patent Document 1).

REFERENCE

Patent Document

[Patent Document 1] U.S. Pat. No. 5,424,969

SUMMARY OF THE INVENTION

A device for temporarily storing a result of processing data or the like, a processing method, a program therefor, and the like is provided.

A circuit (hereinafter, referred to as a selective memory cell) in which a plurality of switches and a signal storing circuit are connected is provided in a data processing device. The details are disclosed below. The selective memory cell can selectively store input data. The selective memory cell can perform at least the following three operations: an operation in which input data is stored in the signal storing circuit and is output, an operation in which input data is output without being stored in the signal storing circuit, and an operation in which a signal stored in the signal storing circuit is output.

Note that a capacitor or a latch circuit can be used as the signal storing circuit, for example. Further, a transistor, a transfer gate, a transmission gate, a three-state buffer, a three-state inverter, or the like can be used as a switch. A three-state buffer is a circuit that can output the following states: a state in which the same signal as an input signal (H or L) is output and an insulating state (high impedance state). A three-state inverter is a circuit that can output the following states: a state in which an inverted signal of an input signal (L or H) is output or an insulating state.

As an example of an effect of the invention, an improvement in information processing speed can be given. Other effects can be given and the details thereof will be described below.

DETAILED DESCRIPTION OF THE INVENTION

Hereinafter, embodiments of the present invention will be described in detail with reference to the accompanying drawings. Note that embodiments of the present invention is not limited to the following description, and it will be easily understood by those skilled in the art that modes and details can be modified in various ways without departing from the spirit and scope of the present invention. Therefore, the contents to be disclosed in this disclosure are not interpreted as being limited to the description of Embodiments below.

Embodiment 1

In this embodiment, some modes of a selective memory cell will be described with reference to FIGS. 1A to 1C, FIGS. 2A and 2B, FIGS. 3A and 2B, FIGS. 4A and 4B, and FIG. 5.

Figure 1C:
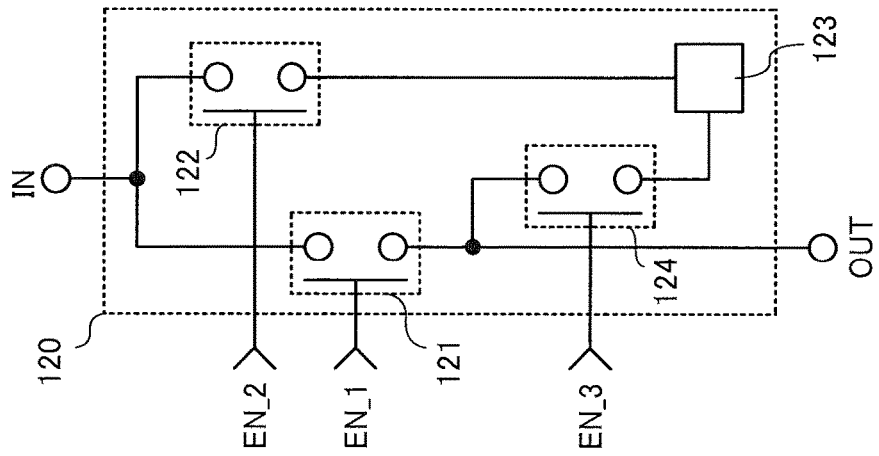
FIGS. 1A to 1C each illustrate a circuit example of a selective memory cell described in Embodiment 1.
Figure 1B:
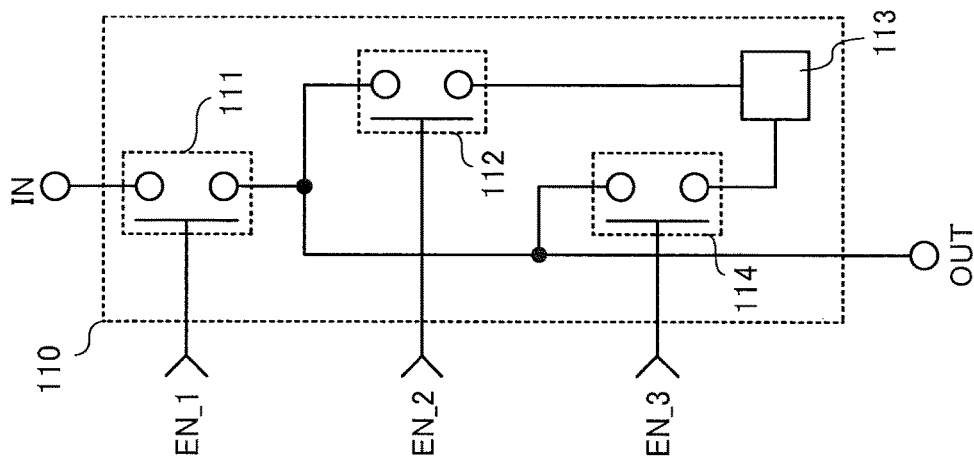
Figure 1A:
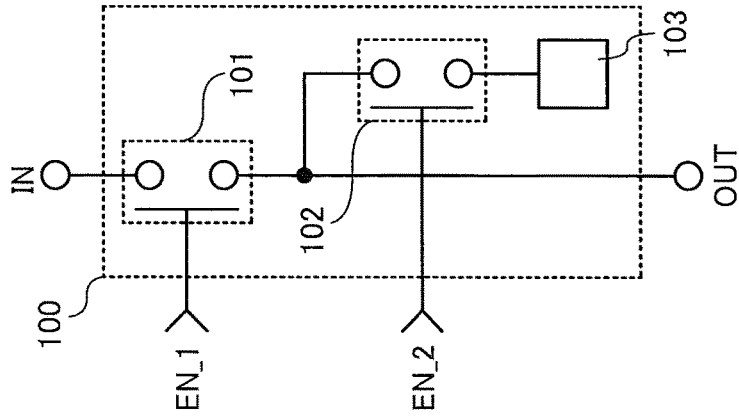

A selective memory cell 100 illustrated in FIG. 1A includes a first switch 101, a second switch 102, and a signal storing circuit 103. A first terminal of the first switch 101 is electrically connected to a first terminal of the second switch 102 and an output terminal OUT. A second terminal of the second switch 102 is electrically connected to the signal storing circuit 103. A second terminal of the first switch 101 is electrically connected to an input terminal IN. An amplifier circuit such as an inverter or a buffer, or another switch may be further provided between any of the input terminal IN, the first switch 101, the second switch 102, the signal storing circuit 103, and the output terminal OUT.

The first switch 101 and the second switch 102 are controlled by a control signal EN_1 and a control signal EN_2, respectively. An operation of the selective memory cell 100 can be selected from at least the following three operations: a first operation in which data (signal) input from the input terminal IN is stored in the signal storing circuit 103 and the input data is output from the output terminal OUT, a second operation in which data input from the input terminal IN is output from the output terminal OUT without being stored in the signal storing circuit 103, and a third operation in which data stored in the signal storing circuit 103 is output from the signal storing circuit.

To perform the first operation, for example, the first switch 101 and the second switch 102 are turned on. To perform the second operation, the first switch 101 is turned on and the second switch 102 is turned off. To perform the third operation, the first switch 101 is turned off and the second switch 102 is turned on.

A selective memory cell 110 illustrated in FIG. 1B includes a first switch 111, a second switch 112, a signal storing circuit 113, and a third switch 114. A first terminal of the first switch 111 is electrically connected to a first terminal of the second switch 112, a first terminal of the third switch 114, and an output terminal OUT. A second terminal of the second switch 112 is electrically connected to a first terminal of the signal storing circuit 113. A second terminal of the third switch 114 is electrically connected to a second terminal of the signal storing circuit 113. A second terminal of the first switch 111 is electrically connected to an input terminal IN. An amplifier circuit such as an inverter or a buffer, or another switch may be further provided between any of the input terminal IN, the first switch 111, the second switch 112, the signal storing circuit 113, the third switch 114, and the output terminal OUT.

The first switch 111, the second switch 112, and the third switch 114 are controlled by a control signal EN_1, a control signal EN_2, and a control signal EN_3, respectively. An operation of the selective memory cell 110 can be selected from at least the following three operations: a first operation in which data input from the input terminal IN is stored in the signal storing circuit 113 and the input data is output from the output terminal OUT, a second operation in which data input from the input terminal IN is output from the output terminal OUT without being stored in the signal storing circuit 113, and a third operation in which data stored in the signal storing circuit 113 is output from the signal storing circuit.

To perform the first operation, for example, the first switch 111 and the second switch 112 are turned on and the third switch 114 is turned off. To perform the second operation, the first switch 111 is turned on and the second switch 112 and the third switch 114 are turned off. To perform the third operation, the first switch 111 is turned off and the third switch 114 is turned on.

A selective memory cell 120 illustrated in FIG. 1C includes a first switch 121, a second switch 122, a signal storing circuit 123, and a third switch 124. A first terminal of the first switch 121 is electrically connected to a first terminal of the third switch 124 and an output terminal OUT. A first terminal of the second switch 122 is electrically connected to a first terminal of the signal storing circuit 123. A second terminal of the third switch 124 is electrically connected to a second terminal of the signal storing circuit 123. A second terminal of the first switch 121 and a second terminal of the second switch 122 are electrically connected to an input terminal IN. An amplifier circuit such as an inverter or a buffer, or another switch may be further provided between any of the input terminal IN, the first switch 121, the second switch 122, the signal storing circuit 123, the third switch 124, and the output terminal OUT.

The first switch 121, the second switch 122, and the third switch 124 are controlled by a control signal EN_1, a control signal EN_2, and a control signal EN_3, respectively. An operation of the selective memory cell 120 can be selected from at least the following three operations: a first operation in which data input from the input terminal IN is stored in the signal storing circuit 123 and the input data is output from the output terminal OUT, a second operation in which data input from the input terminal IN is output from the output terminal OUT without being stored in the signal storing circuit 123, and a third operation in which data stored in the signal storing circuit 123 is output from the output terminal OUT.

To perform the first operation, for example, the first switch 121 and the second switch 122 are turned on and the third switch 124 is turned off. To perform the second operation, the first switch 121 is turned on and the second switch 122 and the third switch 124 are turned off. To perform the third operation, the first switch 121 is turned off and the third switch 124 is turned on.

Figure 2A:
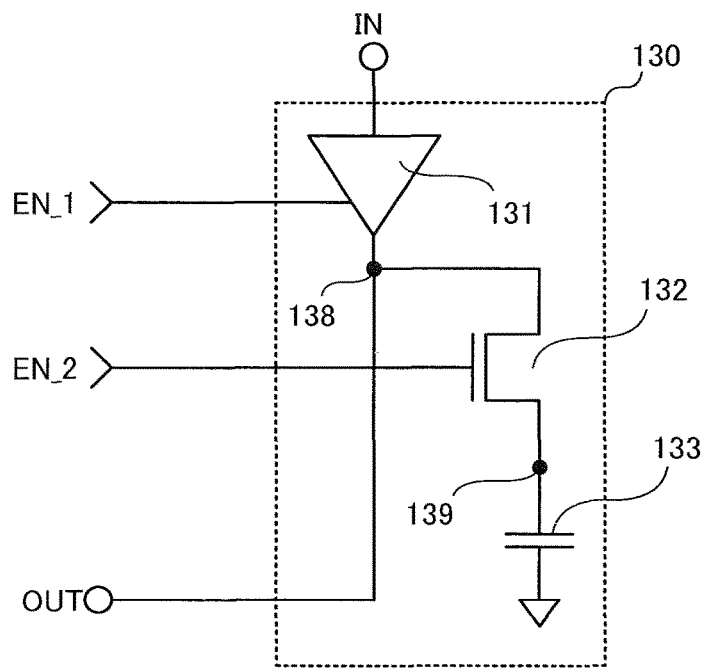
FIGS. 2A and 2B each illustrate a circuit example of a selective memory cell described in Embodiment 1.

FIG. 2A is a circuit diagram of a selective memory cell 130 in which a three-state buffer, a transistor, and a capacitor are used as a first switch, a second switch, and a signal storing circuit, respectively. The selective memory cell 130 includes a three-state buffer 131, a transistor 132, and a capacitor 133. The three-state buffer 131 is controlled by a control signal EN_1 and the transistor 132 is controlled by a control signal EN_2.

In the case where the control signal EN_1 is H, for example, the three-state buffer 131 outputs the same signal as a signal input to an input terminal IN from an output terminal OUT. In the case where the control signal EN_1 is L, input and output terminals of the three-state buffer 131 are electrically isolated (in a high impedance state).

In the case where the control signal EN_2 is H, for example, the transistor 132 is turned on, so that a node of the output terminal of the three-state buffer 131 and the capacitor 133 are electrically connected. In the case where the control signal EN_2 is L, the transistor 132 is turned off, so that the node of the output terminal of the three-state buffer 131 and the capacitor 133 are electrically isolated from each other.

The selective memory cell 130 can store data temporarily or permanently by accumulation of charges in the capacitor 133. The charges accumulated in the capacitor 133 can be stored for an appropriate period when the transistor 132 is turned off. The length of the period can be determined by the off resistance of the transistor 132 and the capacitance of the capacitor 133. When the capacitance of the capacitor 133 is $1 \times 10^{-15}$ F and the off resistance of the transistor 132 is $1 \times 10^{21} \Omega$, for example, more than 90% of the accumulated charges remain in the capacitor 133 even after one hour. Whether charges are stored or not is determined by the potential of a node 139.

It is hard to achieve an off resistance of $1 \times 10^{21} \Omega$ with a MOS transistor formed using silicon; however, such an off resistance can be achieved with a transistor formed using an oxide semiconductor, which will be described later.

Since data is stored in the selective memory cell 130 for a period shorter than one second under normal use, the capacitance of the capacitor 133 and the off resistance of the transistor 132 may be smaller. For example, when the capacitance of the capacitor 133 is $1 \times 10^{-16}$ F and the off resistance of the transistor 132 is $1 \times 10^{17} \Omega$, more than 90% of the accumulated charges remain in the capacitor 133 after one second.

A transistor formed using an extremely thin silicon film can have an off resistance of $1 \times 10^{17} \Omega$.

In the case where the selective memory cell 130 is used in a data processing device, the on resistance of the transistor 132 needs to be sufficiently low. Thus, the on resistance of the transistor 132 and the capacitance of the capacitor 133 need to be set so that the product thereof is shorter than or equal to $10^{-8}$ seconds. For normal use, the product of the on resistance of the transistor 132 and the capacitance of the capacitor 133 is set to be shorter than or equal to $10^{-9}$ seconds.

The operation of the selective memory cell 130 is briefly described. The selective memory cell 130 can let input data (signal) (or data which is the same as the input data) through (or transfer input data to the next stage), store (retain) input data, and output stored data. Note that it is efficient to perform the operation in which data is stored and the operation in which data passes through at the same time. Further, the operation in which stored data is output and the operation in which input data passes through cannot be performed at the same time.

In the case where data passes through the selective memory cell 130, the control signal EN_1 is set so that the input and output terminals of the three-state buffer 131 are electrically connected. As a result, the same signal as a signal (H or L) input to the input terminal IN is output from the output terminal OUT.

In the case where no specific data is stored in the capacitor 133 at this time, the transistor 132 can be on or off. However, in general, when the transistor 132 is on, the gate capacitance of the transistor 132 and the capacitance of the capacitor 133 are added to the node of the output terminal of the three-state buffer 131; thus, operation speed is reduced. For this reason, the transistor 132 is preferably turned off. Note that in the case of storing data in the selective memory cell 130, the transistor 132 is turned on as described later.

In the case where data is stored in the selective memory cell 130, the input and output terminals of the three-state buffer 131 are electrically connected. In addition, the transistor 132 is turned on. As a result, charges corresponding to the potential of a node 138, that is, charges corresponding to the same signal as a signal (H or L) input to the input terminal IN are accumulated in the capacitor 133.

After that, the transistor 132 is turned off. In this case, the output of the three-state buffer 131 should be prevented from being changed before the transistor 132 is turned off. In other words, it is preferable to employ a structure in which the output of the three-state buffer 131 is changed after more than one clock after the transistor 132 is turned off, or a structure in which the output of the three-state buffer 131 is changed after the transistor 132 is turned off owing to any delay circuit.

The larger the number of stages of buffers (inverters) in the three-state buffer 131 is, the later the output of the three-state buffer 131 is, for example.

To keep storing data (to avoid data corruption), the transistor 132 is kept off.

In the case where data stored in the selective memory cell 130 is output, the input and output terminals of the three-state buffer 131 are electrically isolated from each other. In addition, the transistor 132 is turned on. As a result, charges accumulated in the capacitor 133 flow into the node 138 through the transistor 132, whereby the potential of the output terminal OUT corresponds to the data stored in the selective memory cell 130. Note that in the selective memory cell 130, the stored data might get corrupted when the data is output.

Figure 2B:
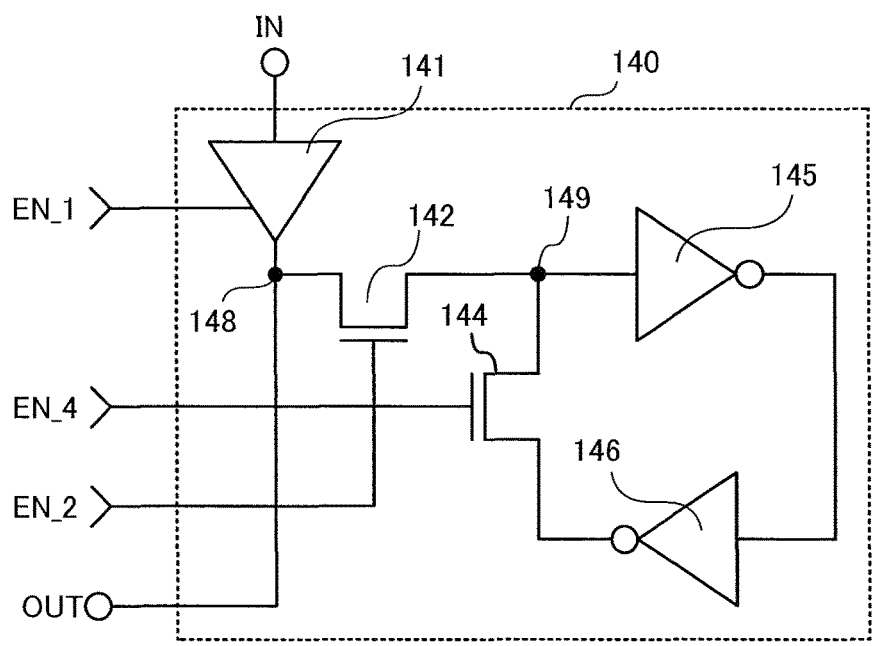

FIG. 2B is a circuit diagram of a selective memory cell 140 in which a three-state buffer, a transistor, and a latch circuit are used as a first switch, a second switch, and a signal storing circuit, respectively. The selective memory cell 140 includes a three-state buffer 141, a transistor 142, a transistor 144, an inverter 145, and an inverter 146. The transistor 144 is provided in a loop formed by the inverter 145 and the inverter 146. FIG. 2B illustrates the case where the transistor 144 is provided between an output terminal of the inverter 146 and an input terminal of the inverter 145.

The three-state buffer 141, the transistor 142, and the transistor 144 are controlled by a control signal EN_1, a control signal EN_2, and a control signal EN_4, respectively.

In the selective memory cell 140, data can be stored in a latch circuit formed by the inverter 145 and the inverter 146. The data is represented by the potential of a node 149, for example.

Although both of the transistors 142 and 144 are n-type transistors in FIG. 2B, the combination of the conductivities of the transistors 142 and 144 is not limited thereto. A transmission gate in which an n-type transistor and a p-type transistor are connected in parallel may be used instead of the transistor 142 or the transistor 144.

The operation of the selective memory cell 140 is briefly described. Similarly to the selective memory cell 130, the selective memory cell 140 can let input data through, store input data, and output stored data. Note that it is efficient to perform the operation in which data is stored and the operation in which data passes through at the same time. Further, the operation in which stored data is output and the operation in which input data passes through cannot be performed at the same time.

In the case where data passes through the selective memory cell 140, the control signal EN_1 is set so that input and output terminals of the three-state buffer 141 are electrically connected. As a result, the same signal as a signal (H or L) input to the input terminal IN is output from the output terminal OUT.

At this time, the transistor 142 can be on or off. In general, it is preferable that the transistor 142 is turned off except for the case where data is stored in the selective memory cell 140.

In the case where data is stored in the selective memory cell 140, the input and output terminals of the three-state buffer 141 are electrically connected and the transistor 144 is turned off. After that, the transistor 142 is turned on. As a result, an inverted signal of the signal input to the input terminal IN is output from the inverter 145, and the same signal as the signal input to the input terminal IN is output from the inverter 146. Then, the transistor 144 is turned on, whereby a stable state is formed by the inverter 145 and the inverter 146. After that, the transistor 142 is turned off. To keep storing data (to avoid data corruption), the transistor 142 is kept off and the transistor 144 is kept on.

In the case where data stored in the selective memory cell 140 is output, the input and output terminals of the three-state buffer 141 are electrically isolated from each other and then, the transistor 142 is turned on. As a result, the potential of the output terminal OUT corresponds to the data stored in the selective memory cell 140. Note that in the selective memory cell 140, the stored data does not get corrupted even when the stored data is output.

Figure 3A:
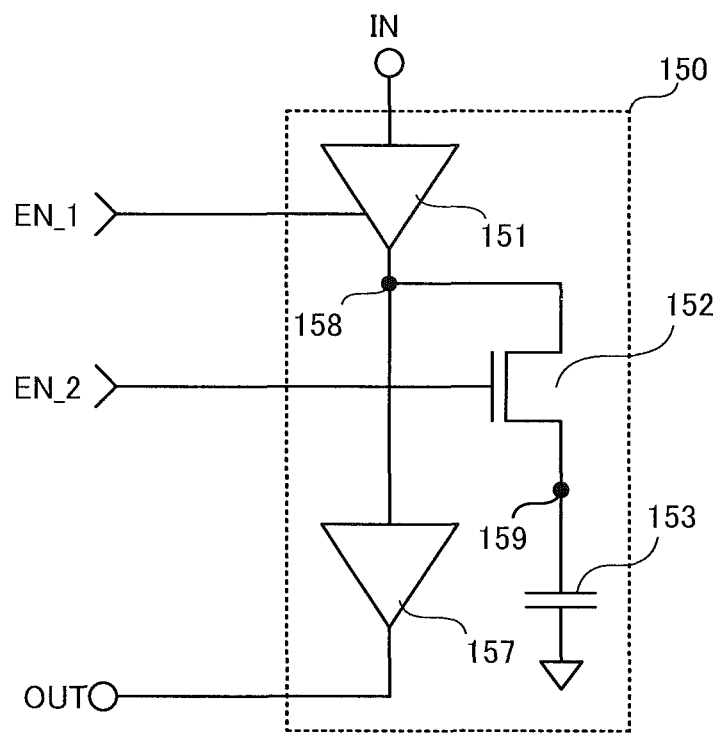
FIGS. 3A and 3B each illustrate a circuit example of a selective memory cell described in Embodiment 1.

FIG. 3A is a circuit diagram of a selective memory cell 150. The selective memory cell 150 includes a three-state buffer 151, a transistor 152, a capacitor 153, and a buffer 157. The three-state buffer 151 and the transistor 152 are controlled by a control signal EN_1 and a control signal EN_2, respectively.

The selective memory cell 150 and the selective memory cell 130 are similar in many respects, but in the selective memory cell 150, an input terminal of the buffer 157 is provided close to an output terminal of the three-state buffer 151. With such a configuration, the parasitic capacitance of a node 158 can be sufficiently reduced.

As the parasitic capacitance of the node 158 becomes larger than the capacitance of the capacitor 153, a change in the potential of the node 158 due to charges in the capacitor 153 caused when the transistor 152 is turned on to make an electrical connection between the capacitor 153 (or a node 159) and the node 158 becomes small.

The parasitic capacitance of the node 158 needs to be smaller than the capacitance of the capacitor 153 so as not to affect the operation. The configuration of the selective memory cell 150 is suitable for the purpose. Similarly to the selective memory cell 130 and the selective memory cell 140, the selective memory cell 150 can let input data through, store input data, and output stored data. The operation of the selective memory cell 130 can be referred to for the operation of the selective memory cell 150.

Figure 3B:
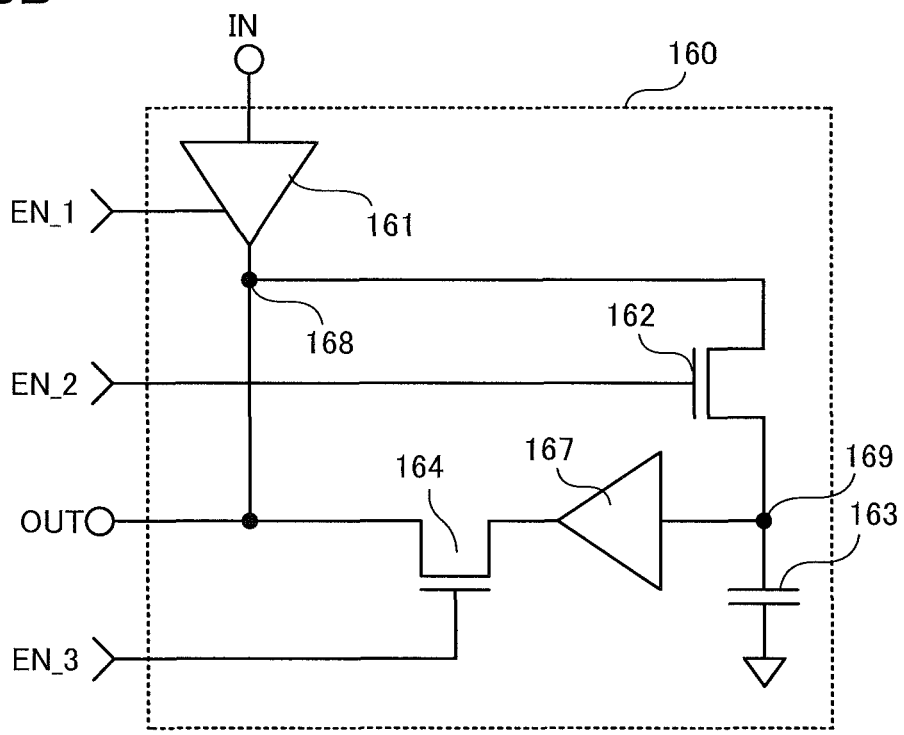

FIG. 3B is a circuit diagram of a selective memory cell 160 in which a three-state buffer, a transistor, and a circuit in which a capacitor and a buffer are combined are used as a first switch, a second switch, and a signal storing circuit, respectively. The selective memory cell 160 includes a three-state buffer 161, a transistor 162, a capacitor 163, a transistor 164, and a buffer 167. The three-state buffer 161, the transistor 162, and the transistor 164 are controlled by a control signal EN_1, a control signal EN_2, and a control signal EN_3, respectively.

A transistor whose off resistance is sufficiently high is preferably used as the transistor 162, and the transistor formed using an oxide semiconductor, which is described later, can be used. In contrast, there is no such a limitation on the transistor 164, and any kind of transistor or transmission gate having any conductivity can be used.

The selective memory cell 160 and the selective memory cell 130 are similar in many respects, but in the selective memory cell 160, an input terminal of the buffer 167 is provided at anode 169. With such a configuration, the node 168 can have a potential reflecting charges stored in the capacitor 163 even when the parasitic capacitance of a node 168 is large.

Note that although two stages of inverters are connected in series in the buffer 167, the structure of the buffer 167 is not limited thereto and it may include only one stage or three or more stages of inverters. It should be noted that since output is inverted with an odd number of stages of inverters connected in series, the inverted output needs to be corrected at any step.

The operation of the selective memory cell 160 is briefly described. Similarly to the selective memory cell 130, the selective memory cell 140, and the selective memory cell 150, the selective memory cell 160 can let input data through, store input data, and output stored data. Note that it is efficient to perform the operation in which data is stored and the operation in which data passes through at the same time. Further, the operation in which stored data is output and the operation in which input data passes through cannot be performed at the same time.

In the case where data passes through the selective memory cell 160, the control signal EN_1 is set so that input and output terminals of the three-state buffer 161 are electrically connected. As a result, the same signal as a signal (H or L) input to the input terminal IN is output from the output terminal OUT.

At this time, the transistor 162 can be on or off. In general, it is preferable that the transistor 162 is turned off except for the case where data is stored in the selective memory cell 160. Further, the transistor 164 is turned off In the case where data is stored in the selective memory cell 160, the input and output terminals of the three-state buffer 161 are electrically connected. In addition, the transistor 162 is turned on. As a result, charges corresponding to the potential of the node 168, that is, charges corresponding to the same signal as a signal (H or L) input to the input terminal IN are accumulated in the capacitor 163. After that, the transistor 162 is turned off. To keep storing data (to avoid data corruption), the transistor 162 is kept off.

In the case where data stored in the selective memory cell 160 is output, the input and output terminals of the three-state buffer 161 are electrically isolated from each other. In addition, the transistor 162 is kept off. After that, the transistor 164 is turned on. As a result, a potential corresponding to charges accumulated in the capacitor 163 is output from the buffer 167 through the transistor 164, whereby the potential of the output terminal OUT corresponds to the data stored in the selective memory cell 160. Note that in the selective memory cell 160, the stored data does not get corrupted even when the stored data is output.

Figure 4A:
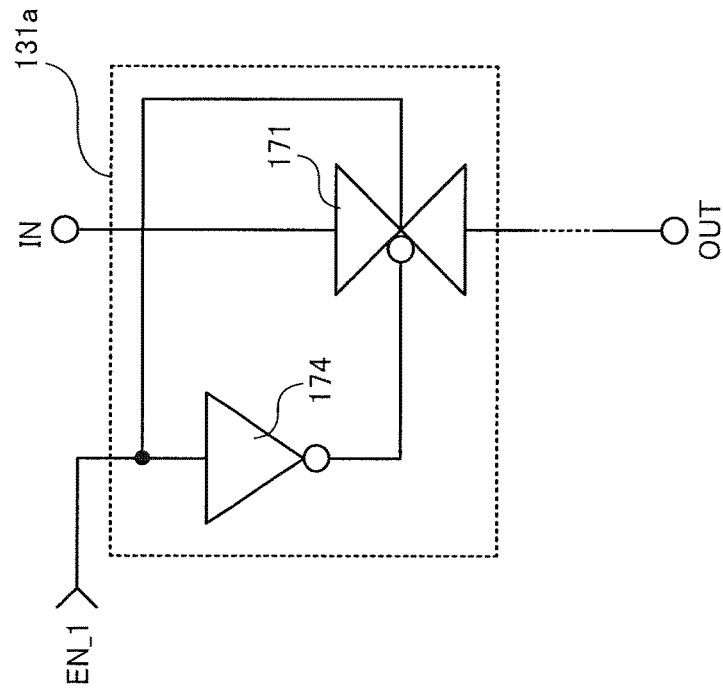
FIGS. 4A and 4B each illustrate a circuit example of a three-state buffer described in Embodiment 1.

FIG. 4A illustrates an example of the three-state buffer 131 that can be used in the selective memory cell 130. The three-state buffer 131 includes a transmission gate 171, an inverter 172, an inverter 173, an inverter 174, and an inverter 175. A three-state buffer having a similar structure can be used in the selective memory cell 140, the selective memory cell 150, or the selective memory cell 160.

A control signal EN_1 is inverted by the inverter 175. Some inverted signals are input to one control electrode of the transmission gate 171 and the rest of the signals are inverted again by the inverter 174 and are input to the other control electrode of the transmission gate 171. In FIG. 4A, the transmission gate 171 is in a conducting state when the control signal EN_1 is H, whereas the transmission gate 171 is in an insulating state when the control signal EN_1 is L.

Although two inverters, the inverter 172 and the inverter 173, are provided between an input terminal IN and the transmission gate 171, the number of inverters provided at that position is not limited to two and can be any number as long as it is one or more. Note that when the number of provided inverters is odd, a signal input to the input terminal IN is inverted and is output from the transmission gate 171.

Figure 4B:
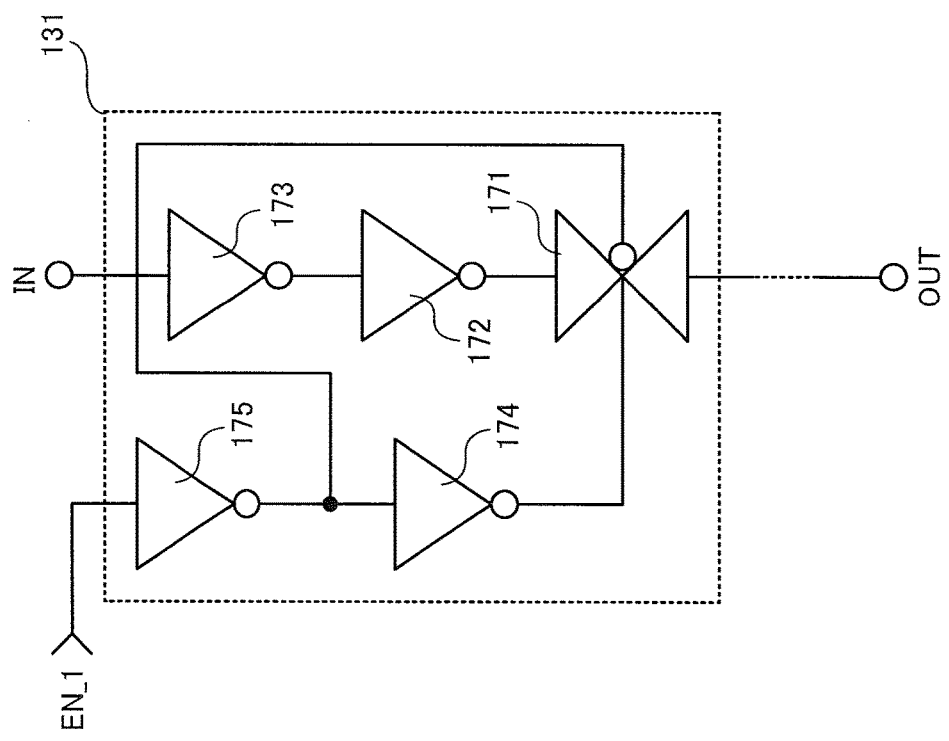

The three-state buffer 131 illustrated in FIG. 4A can be more simplified and can have a structure only including the transmission gate 171 and the inverter 174 like a switch 131a illustrated in FIG. 4B, for example. The switch 131a is the three-state buffer 131 without the inverter 172, the inverter 173, and the inverter 175.

Figure 5:
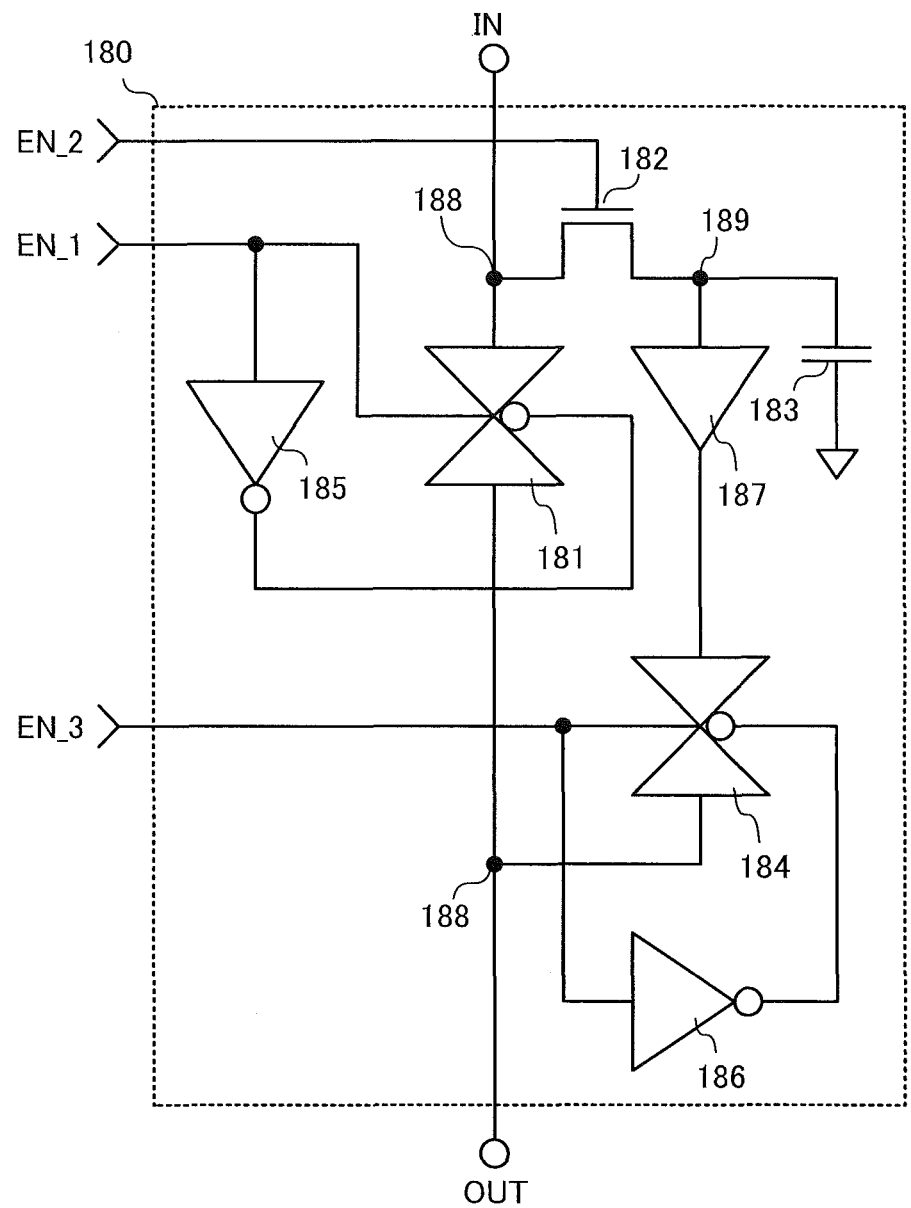
FIG. 5 illustrates a circuit example of a selective memory cell described in Embodiment 1.

FIG. 5 is a circuit diagram of a selective memory cell 180 in which transmission gates are used as a first switch and a second switch and a capacitor is used as a signal storing circuit. The selective memory cell 180 includes a transmission gate 181, a transistor 182, a capacitor 183, a transmission gate 184, an inverter 185, an inverter 186, and a buffer 187. A transistor whose off resistance is sufficiently high is preferably used as the transistor 182, and the transistor formed using an oxide semiconductor, which is described later, can be used.

An inverter or a buffer may be further provided between any of an input terminal IN, the transmission gate 181, the transistor 182, the capacitor 183, the transmission gate 184, the inverter 185, the inverter 186, the buffer 187, and an output terminal OUT.

The transmission gate 181 is controlled by a control signal EN_1 and a complementary signal thereof generated by the inverter 185. The transistor 182 is controlled by a control signal EN_2. The transmission gate 184 is controlled by a control signal EN_3 and a complementary signal thereof generated by the inverter 186.

Note that in general, two stages of inverters are connected in series in the buffer 187; however, the structure of the buffer 187 is not limited thereto and it may include only one stage or three or more stages of inverters. It should be noted that since output is inverted with an odd number of stages of inverters connected in series, the inverted output needs to be corrected at any step.

The operation of the selective memory cell 180 is briefly described. Similarly to the selective memory cell 130, the selective memory cell 140, the selective memory cell 150, and the selective memory cell 160, the selective memory cell 180 can let input data through, store input data, and output stored data. Note that it is efficient to perform the operation in which data is stored and the operation in which data passes through at the same time. Further, the operation in which stored data is output and the operation in which input data passes through cannot be performed at the same time.

In the case where data passes through the selective memory cell 180, the control signal EN_1 is set so that input and output terminals of the transmission gate 181 are electrically connected. As a result, the same signal as a signal (H or L) input to the input terminal IN is output from the output terminal OUT.

At this time, the transistor 182 can be on or off. In general, it is preferable that the transistor 182 is turned off except for the case where data is stored in the selective memory cell 180. Further, input and output terminals of the transmission gate 184 are made electrically isolated from each other.

In the case where data is stored in the selective memory cell 180, the input and output terminals of the transmission gate 181 are electrically connected. In addition, the transistor 182 is turned on. As a result, charges corresponding to the potential of a node 188, that is, charges corresponding to the same signal as a signal (H or L) input to the input terminal IN are accumulated in the capacitor 183. After that, the transistor 182 is turned off. To keep storing data (to avoid data corruption), the transistor 182 is kept off.

In the case where data stored in the selective memory cell 180 is output, the input and output terminals of the transmission gate 181 are electrically isolated from each other. In addition, the transistor 182 is kept off. After that, the input and output terminals of the transmission gate 184 are electrically connected. As a result, a potential corresponding to charges accumulated in the capacitor 183 (the potential of a node 189) is output from the transmission gate 184 through the buffer 187, whereby the potential of the output terminal OUT corresponds to the data stored in the selective memory cell 180. Note that in the selective memory cell 180, the stored data does not get corrupted even when the stored data is output.

Next, an oxide semiconductor that can be used in the transistor 132, the transistor 152, and the transistor 162 will be described.

The oxide semiconductor contains indium, for example. An oxide semiconductor containing indium has high carrier mobility (electron mobility). An oxide semiconductor preferably contains an element M. Examples of the element M include aluminum, gallium, yttrium, and tin. The element M has high bond energy to oxygen, for example. The element M increases the energy gap of the oxide semiconductor, for example. Further, the oxide semiconductor preferably contains zinc. When containing zinc, the oxide semiconductor is likely to be crystalline. The valence band edge (Ev) of the oxide semiconductor can be controlled by, for example, the atomic ratio of zinc, in some cases.

The oxide semiconductor does not necessarily contain indium. The oxide semiconductor may be, for example, Zn—Sn oxide or Ga—Sn oxide.

The oxide semiconductor may be In-M-Zn oxide having any of the following atomic ratios of In to M, when Zn and O are not taken into consideration: the atomic percentage of In is smaller than 50 atomic % and the atomic percentage of M is larger than or equal to 50 atomic %, and the atomic percentage of In is smaller than 25 atomic % and the atomic percentage of M is larger than or equal to 75 atomic %. Further, the oxide semiconductor may be In-M-Zn oxide having any of the following atomic ratios of In to M: the atomic percentage of In is larger than or equal to 25 atomic % and the atomic percentage of M is smaller than 75 atomic %, and the atomic percentage of In is larger than or equal to 34 atomic % and the atomic percentage of M is smaller than 66 atomic %.

The oxide semiconductor has a large energy gap. The energy gap of the oxide semiconductor is greater than or equal to 2.7 eV and less than or equal to 4.9 eV, preferably greater than or equal to 3 eV and less than or equal to 4.7 eV, more preferably greater than or equal to 3.2 eV and less than or equal to 4.4 eV.

In order to obtain stable electrical characteristics of a transistor, it is effective to reduce the concentration of impurities in the oxide semiconductor so that the oxide semiconductor is highly purified to be intrinsic. In the oxide semiconductor, a light element, a semimetal element, a metal element, and the like (lower than 1 atomic %) other than main components serve as impurities. For example, hydrogen, lithium, carbon, nitrogen, fluorine, sodium, silicon, chlorine, potassium, calcium, titanium, iron, nickel, copper, germanium, strontium, zirconium, and hafnium are impurities in the oxide in some cases. Thus, it is preferable that the concentration of impurities in a film close to the oxide semiconductor be lowered too.

For example, in some cases, silicon in an oxide semiconductor forms impurity states. Further, in some cases, silicon at the surface of an oxide semiconductor forms impurity states. The concentration of silicon in an oxide semiconductor or at the surface of an oxide semiconductor measured by secondary ion mass spectrometry (SIMS) is lower than $1 \times 10^{19}$ atoms/cm$^3$, preferably lower than $5 \times 10^{18}$ atoms/cm$^3$, more preferably lower than $2 \times 10^{18}$ atoms/cm$^3$.

Further, in some cases, hydrogen in an oxide semiconductor forms impurity states, whereby carrier density is increased. Thus, the concentration of hydrogen in the oxide semiconductor, which is measured by SIMS, can be set to lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$. Further, in some cases, nitrogen in an oxide semiconductor forms impurity states, whereby carrier density is increased. Thus, the concentration of nitrogen in the oxide semiconductor, which is measured by SIMS, can be lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

An oxide semiconductor may include a non-single-crystal, for example. The non-single-crystal state is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear boundary does not exist, for example, high density of defect states is unlikely to occur. In the CAAC-OS, since a clear grain boundary does not exist, for example, a reduction in electron mobility is small.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at $2\theta$ of around 31° which shows alignment appears in some cases. Further, for example, spots (luminescent spots) are shown in an electron diffraction pattern of the CAAC-OS in some cases. An electron diffraction pattern obtained with an electron beam having a diameter of 10 nm$\phi$ or smaller, or 5 nm$\phi$ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Further, the CAAC-OS can be formed by reducing the density of defect states for example. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has low density of trap states in some cases. Thus, the transistor including the oxide semiconductor in the channel formation region has a small variation in electrical characteristics and high reliability in some cases. A charge trapped by the trap states in the oxide semiconductor takes a long time to disappear. The trapped charge may behave like a fixed charge. Thus, the transistor which includes the oxide semiconductor having a high density of trap states in the channel formation region has unstable electrical characteristics in some cases.

With the use of the highly purified intrinsic or substantially highly purified intrinsic CAAC-OS in a transistor, variation in the electrical characteristics of the transistor due to irradiation with visible light or ultraviolet light is small.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly observed in some cases. In an image of the nc-OS obtained with a TEM, for example, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is small.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than the diameter of a crystal part, a peak which shows alignment does not appear in some cases. Further, for example, a halo pattern is shown in some cases in an electron diffraction pattern of the nc-OS obtained by using an electron beam having a diameter larger than the diameter of a crystal part (for example, a beam diameter of 20 nm$\phi$ or more, or 50 nm$\phi$ or more). For example, spots are shown in some cases in a nanobeam electron diffraction pattern of the nc-OS obtained by using an electron beam having a diameter smaller than the diameter of a crystal part (for example, a beam diameter of 10 nm$\phi$ or less, or 5 nm$\phi$ or less). In a nanobeam electron diffraction pattern of the nc-OS, for example, regions with high luminance in a circular pattern are shown in some cases. In a nanobeam electron diffraction pattern of the nc-OS, for example, a plurality of spots are shown in the region in some cases.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

The oxide semiconductor may be composed of a multilayer film. For example, a multilayer film in which an oxide semiconductor layer (OS1) and an oxide semiconductor layer (OS2) are stacked in this order may be used.

In this case, the conduction band edge (Ec) of the oxide semiconductor layer (OS2) is made lower than that of the oxide semiconductor layer (OS1), for example. Specifically, for the oxide semiconductor layer (OS2), an oxide semiconductor having higher electron affinity than the oxide semiconductor layer (OS1) by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the conduction band edge.

Alternatively, the energy gap of the oxide semiconductor layer (OS2) is made smaller than that of the oxide semiconductor layer (OS1), for example. The energy gap can be obtained by, for example, an optical method. Specifically, for the oxide semiconductor layer (OS2), an oxide semiconductor having smaller energy gap than the oxide semiconductor layer (OS1) by greater than or equal to 0.1 eV and smaller than or equal to 1.2 eV, preferably by greater than or equal to 0.2 eV and smaller than or equal to 0.8 eV is used.

Alternatively, the oxide semiconductor may be composed of, for example, a multilayer film in which the oxide semiconductor layer (OS1), the oxide semiconductor layer (OS2), and an oxide semiconductor layer (OS3) are stacked in this order.

In this case, the conduction band edge (Ec) of the oxide semiconductor layer (OS2) is made lower than that of the oxide semiconductor layer (OS1) and that of the oxide semiconductor layer (OS3), for example. Specifically, for the oxide semiconductor layer (OS2), an oxide semiconductor having higher electron affinity than the oxide semiconductor layer (OS1) and the oxide semiconductor layer (OS3) by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used.

Alternatively, the energy gap of the oxide semiconductor layer (OS2) is made smaller than that of the oxide semiconductor layer (OS1) and that of the oxide semiconductor layer (OS3), for example. Specifically, for the oxide semiconductor layer (OS2), an oxide semiconductor having smaller energy gap than the oxide semiconductor layer (OS1) and the oxide semiconductor layer (OS3) by greater than or equal to 0.1 eV and smaller than or equal to 1.2 eV, preferably by greater than or equal to 0.2 eV and smaller than or equal to 0.8 eV is used.

To increase the on-state current of the transistor, for example, the thickness of the oxide semiconductor layer (OS3) is preferably as small as possible. For example, the thickness of the oxide semiconductor layer (OS3) is less than 10 nm, preferably less than or equal to 5 nm, more preferably less than or equal to 3 nm. In contrast, the oxide semiconductor layer (OS3) blocks entry of elements (e.g., silicon) contained in the gate insulating film to the oxide semiconductor layer (OS2) having a high current density. Thus, the oxide semiconductor layer (OS3) preferably has a certain thickness. For example, the thickness of the oxide semiconductor layer (OS3) is greater than or equal to 0.3 nm, preferably greater than or equal to 1 nm, more preferably greater than or equal to 2 nm.

The oxide semiconductor layer (OS1) is preferably formed thick. The oxide semiconductor layers (OS2) and (OS3) are preferably formed thin. Specifically, the thickness of the oxide semiconductor layer (OS1) is greater than or equal to 20 nm, preferably greater than or equal to 30 nm, more preferably greater than or equal to 40 nm, still more preferably greater than or equal to 60 nm. With the oxide semiconductor layer (OS1) having the above thickness, the interface between the insulating film and the oxide semiconductor layer (OS1) can be separated from the oxide semiconductor layer (OS2) having a high current density to have a distance greater than or equal to 20 nm, preferably greater than or equal to 30 nm, more preferably greater than or equal to 40 nm, still more preferably greater than or equal to 60 nm. To prevent the productivity of the semiconductor device from being lowered, the thickness of the oxide semiconductor layer (OS1) is smaller than or equal to 200 nm, preferably smaller than or equal to 120 nm, more preferably smaller than or equal to 80 nm. The thickness of the oxide semiconductor layer (OS2) is greater than or equal to 3 nm and less than or equal to 100 nm, preferably greater than or equal to 3 nm and less than or equal to 80 nm, more preferably greater than or equal to 3 nm and less than or equal to 50 nm.

For example, the thickness of the oxide semiconductor layer (OS1) may be greater than that of the oxide semiconductor layer (OS2), and the thickness of the oxide semiconductor layer (OS2) may be greater than that of the oxide semiconductor layer (OS3).

A single layer or a multiple layer of the above described oxide semiconductor can be used for channels of the transistor 132, the transistor 152, and the transistor 162.

Embodiment 2

In this embodiment, an example of a data processing device including the selective memory cell described in Embodiment 1 and an example of a data processing method will be described with reference to FIGS. 6A and 6B and FIGS. 7A and 7B.

Figure 6A:
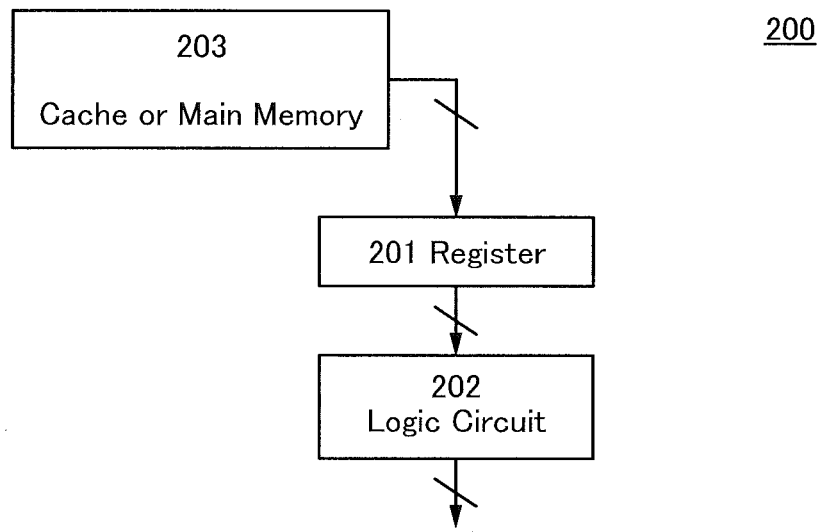
FIGS. 6A and 6B each illustrate an example of a block diagram of a data processing device described in Embodiment 2.

FIG. 6A illustrates part of a data processing device 200. A register 201, a logic circuit 202, and a memory 203 in the data processing device 200 are illustrated in FIG. 6A. The memory 203 is a cache memory or a main memory and is provided in a region relatively apart from the register 201 and the logic circuit 202.

In the data processing device 200, part of data stored in the memory 203 is transferred to the register 201, processed in the logic circuit 202, and then transferred. Here, the case where the register 201 in the data processing device 200 is an N-bit register and the following processes (1) to (3) are performed in this order is described.
(1) An N-bit sequence which is obtained by performing arithmetic processing X on N-bit sequence A in the logic circuit is transferred.
(2) An N-bit sequence which is obtained by performing arithmetic processing X on N-bit sequence B (sequence B is different from sequence A) in the logic circuit is transferred.
(3) An N-bit sequence which is obtained by performing arithmetic processing X on N-bit sequence A in the logic circuit is transferred.

First, N-bit sequence A transferred from the memory 203 is input to the register 201. Then, N-bit sequence A is processed in the logic circuit 202 and transferred (process (1)). Next, N-bit sequence B transferred from the memory 203 is input to the register 201. Note that N-bit sequence A which has been in the register 201 until this time is overwritten with sequence B. Then, N-bit sequence B is processed in the logic circuit 202 and transferred (process (2)). Lastly, N-bit sequence A transferred from the memory 203 is input to the register 201. In a manner similar to that in the case of process (2), sequence B which has been in the register 201 until this time is overwritten with sequence A. Then, N-bit sequence A is processed in the logic circuit 202 and transferred (process (3)).

As described above, sequence A or sequence B is transferred from the memory 203 in every process. Since the memory 203 is apart from the register 201 and the logic circuit 202, it takes time to transfer a sequence.

Figure 6B:
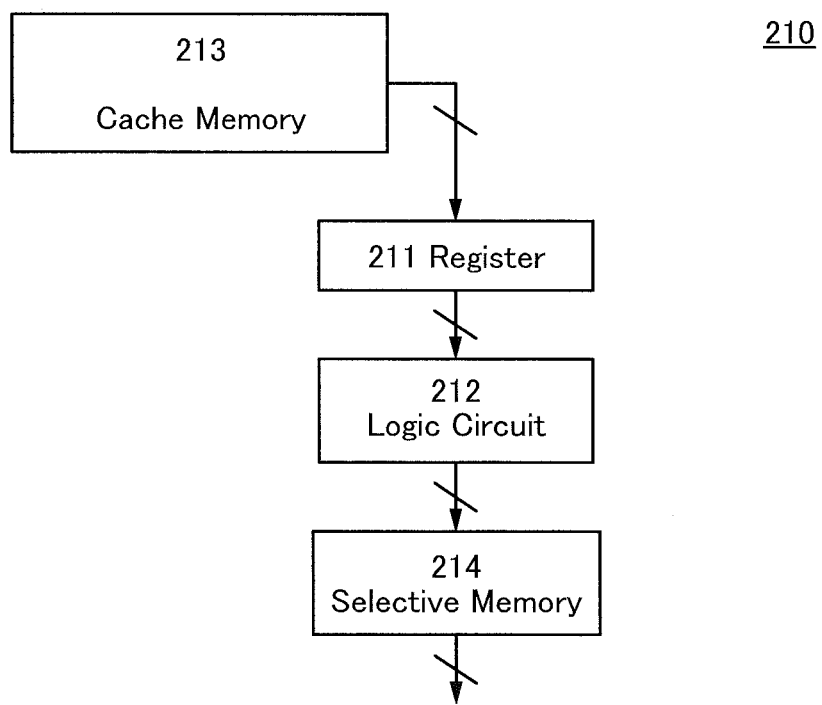

FIG. 6B illustrates part of a data processing device 210 including a selective memory 214. A register 211, a logic circuit 212, a memory 213, and the selective memory 214 in the data processing device 210 are illustrated in FIG. 6B. The memory 213 is a cache memory or a main memory and is provided in a region relatively apart from the register 211 and the logic circuit 212.

In the case where three or more processes are performed in the data processing device 210, the most frequently performed process is selected and the result obtained when the most frequently performed process is performed for the first time is stored in a signal storing circuit. The result stored in the signal storing circuit is output when the most frequently performed process is performed for the second time, whereby processing time can be reduced. Further, the result stored in the signal storing circuit can be output when the most frequently performed process is performed for the third time.

Such a processing method can be stored inside or outside the data processing device as a computer program, or can be sent, received, or relayed via a communication line. The data processing device implements the data processing method when the computer program is executed.

The selective memory 214 includes a plurality of selective memory cells described in Embodiment 1. The numbers of input terminals and output terminals each agree with the number of the selective memory cells. For example, in the case where 64 selective memory cells are provided in parallel, a selective memory including 64 input terminals and 64 output terminals can be formed. Here, the case where the register 211 is an N-bit register, the selective memory 214 is an N-bit memory, and the above-described processes (1) to (3) are performed in this order is described.

It is needless to say that, as in the data processing device 200, a required sequence can be transferred from the memory 213 to the register 211 in each time. However, an optimum processing method can be chosen in the data processing device 210 including the selective memory 214 when the order of processes is programmed.

First, N-bit sequence A transferred from the memory 213 is input to the register 211. Then, N-bit sequence A is processed in the logic circuit 212 and transferred through the selective memory 214 (process (1)). At the same time, an N-bit sequence obtained by processing (a sequence obtained in process (1)) is stored in the selective memory 214.

Next, N-bit sequence B transferred from the memory 213 is input to the register 211. Note that N-bit sequence A which has been in the register 211 until this time is overwritten with sequence B. Then, N-bit sequence B is processed in the logic circuit 212 and transferred (process (2)). An N-bit sequence obtained by processing here is transferred without being stored in the selective memory 214. The selective memory 214 keeps storing the sequence obtained in process (1) without rewriting.

Lastly, process (3) is performed. Since process (3) is the same as process (1) and the result has already been stored in the selective memory 214, the stored data is transferred.

When the data processing device 200 and the data processing device 210 in process (3) are compared, the data processing device 210 does not require a step in which sequence A is transferred from the memory 203 to the register 201 and a step in which arithmetic processing X is performed in the logic circuit 202 unlike the data processing device 200; thus, the data processing device 210 can perform process (3) at higher speed.

In the case where a plurality of processes are performed and there is a frequently performed process, the result is stored in the selective memory 214, so that the processes can be performed at high speed. The case where the following processes (1) to (10) are performed in this order is described as an example.
(1) An N-bit sequence which is obtained by performing arithmetic processing X on N-bit sequence A in the logic circuit is transferred.
(2) An N-bit sequence which is obtained by performing arithmetic processing X on N-bit sequence B (sequence B is different from sequence A) in the logic circuit is transferred.
(3) An N-bit sequence which is obtained by performing arithmetic processing X on N-bit sequence A in the logic circuit is transferred.
(4) An N-bit sequence which is obtained by performing arithmetic processing X on N-bit sequence C (sequence C is different from sequence A and sequence B) in the logic circuit is transferred.
(5) An N-bit sequence which is obtained by performing arithmetic processing X on N-bit sequence A in the logic circuit is transferred.
(6) An N-bit sequence which is obtained by performing arithmetic processing X on N-bit sequence D (sequence D is different from sequence A, sequence B, and sequence C) in the logic circuit is transferred.
(7) An N-bit sequence which is obtained by performing arithmetic processing X on N-bit sequence A in the logic circuit is transferred.
(8) An N-bit sequence which is obtained by performing arithmetic processing X on N-bit sequence B in the logic circuit is transferred.
(9) An N-bit sequence which is obtained by performing arithmetic processing X on N-bit sequence C in the logic circuit is transferred.
(10) An N-bit sequence which is obtained by performing arithmetic processing X on N-bit sequence A in the logic circuit is transferred.

In this case, processes (1), (3), (5), (7), and (10) are the same process and the most frequently performed process. The sequence obtained in process (1) is stored in the selective memory 214 as described above, whereby the stored sequence has only to be transferred in process (3). It should be noted that a processing method after process (5) varies depending on the kind of selective memory cell used in the selective memory 214.

The case where a selective memory cell in which data gets corrupted in data reading is used in the selective memory 214 is described as an example. In the selective memory cell 130 or the selective memory cell 150, for example, data might get corrupted in data reading.

In process (3), the data stored in the selective memory 214 can be transferred. However, the data stored in the selective memory 214 gets corrupted at this stage; thus, sequence A needs to be transferred from the memory 213 to the register 211 to perform process (5). The sequence obtained by performing arithmetic processing X in the logic circuit 212 is stored in the selective memory 214 and can be used in process (7). To perform process (10), sequence A needs to be transferred again from the memory 213 to the register 211.

In other words, a sequence needs to be transferred from the memory 213 to the register 211 in processes (1), (2), (4), (5), (6), (8), (9), and (10) and does not need to be transferred in processes (3) and (7).

In contrast, in the case where a selective memory cell in which data does not get corrupted in data reading (e.g., the selective memory cell 140 or the selective memory cell 160) is used in the selective memory 214, the frequency of transferring a sequence from the memory 213 to the register 211 can be reduced.

In the selective memory cell 140 or the selective memory cell 160, stored data does not get corrupted even after being output; thus, the sequence obtained in process (1) can be used in processes (3), (5), (7), and (10). In other words, the sequence obtained in process (1) is stored in the selective memory 214 and can be output in processes (3), (5), (7), and (10).

In other words, a sequence needs to be transferred from the memory 213 to the register 211 in processes (1), (2), (4), (6), (8) and (9) and does not need to be transferred in processes (3), (5), (7), and (10).

Next, the case where the following processes (1) to (20) are performed in this order is described.

(1) An N-bit sequence which is obtained by performing arithmetic processing X on N-bit sequence A in the logic circuit is transferred.
(2) An N-bit sequence which is obtained by performing arithmetic processing X on N-bit sequence B (sequence B is different from sequence A) in the logic circuit is transferred.
(3) An N-bit sequence which is obtained by performing arithmetic processing X on N-bit sequence A in the logic circuit is transferred.
(4) An N-bit sequence which is obtained by performing arithmetic processing X on N-bit sequence C (sequence C is different from sequence A and sequence B) in the logic circuit is transferred.
(5) An N-bit sequence which is obtained by performing arithmetic processing X on N-bit sequence A in the logic circuit is transferred.
(6) An N-bit sequence which is obtained by performing arithmetic processing X on N-bit sequence D (sequence D is different from sequence A, sequence B, and sequence C) in the logic circuit is transferred.
(7) An N-bit sequence which is obtained by performing arithmetic processing X on N-bit sequence A in the logic circuit is transferred.
(8) An N-bit sequence which is obtained by performing arithmetic processing X on N-bit sequence B in the logic circuit is transferred.
(9) An N-bit sequence which is obtained by performing arithmetic processing X on N-bit sequence C in the logic circuit is transferred.
(10) An N-bit sequence which is obtained by performing arithmetic processing X on N-bit sequence A in the logic circuit is transferred.
(11) An N-bit sequence which is obtained by performing arithmetic processing X on N-bit sequence B in the logic circuit is transferred.
(12) An N-bit sequence which is obtained by performing arithmetic processing X on N-bit sequence D in the logic circuit is transferred.
(13) An N-bit sequence which is obtained by performing arithmetic processing X on N-bit sequence B in the logic circuit is transferred.
(14) An N-bit sequence which is obtained by performing arithmetic processing X on N-bit sequence A in the logic circuit is transferred.
(15) An N-bit sequence which is obtained by performing arithmetic processing X on N-bit sequence B in the logic circuit is transferred.
(16) An N-bit sequence which is obtained by performing arithmetic processing X on N-bit sequence C in the logic circuit is transferred.
(17) An N-bit sequence which is obtained by performing arithmetic processing X on N-bit sequence B in the logic circuit is transferred.
(18) An N-bit sequence which is obtained by performing arithmetic processing X on N-bit sequence D in the logic circuit is transferred.
(19) An N-bit sequence which is obtained by performing arithmetic processing X on N-bit sequence B in the logic circuit is transferred.
(20) An N-bit sequence which is obtained by performing arithmetic processing X on N-bit sequence A in the logic circuit is transferred.

In such a case, in process (11) or later, the frequency of the process in which "an N-bit sequence which is obtained by performing arithmetic processing X on N-bit sequence A in the logic circuit is transferred" is reduced and the frequency of the process in which "an N-bit sequence which is obtained by performing arithmetic processing X on N-bit sequence B in the logic circuit is transferred" is increased. For this reason, unlike in processes in process (10) or earlier, the sequence obtained in process (11) is stored in the selective memory 214 in process (11) or later and is output in processes (13), (15), (17), and (19).

Figure 7A:
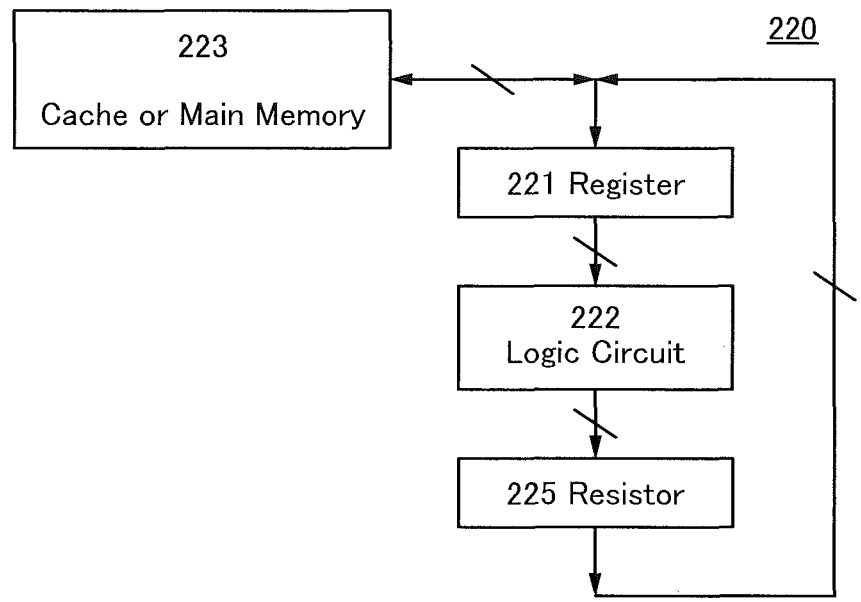
FIGS. 7A and 7B each illustrate an example of a block diagram of a data processing device described in Embodiment 2.

FIG. 7A illustrates part of a data processing device 220. A register 221, a logic circuit 222, a memory 223, and a register 225 in the data processing device 220 are illustrated in FIG. 7A. The memory 223 is a cache memory or a main memory and is provided in a region relatively apart from the register 221, the logic circuit 222, and the register 225.

Further, data output from the logic circuit 222 is transferred to the register 221 or the memory 223 through the register 225. Here, the case where the register 221 and the register 225 in the data processing device 220 are N-bit registers and the following processes (21) to (24) are performed in this order is described.

(21) N-bit sequence e is obtained by performing arithmetic processing Y on N-bit sequence E in the logic circuit.

(22) N-bit sequence f is obtained by performing arithmetic processing Y on N-bit sequence F (sequence F is different from sequence E) in the logic circuit.

(23) N-bit sequence G which is obtained by performing arithmetic processing Y on N-bit sequence f (sequence f is different from sequence E and sequence F) in the logic circuit is transferred to the memory.

(24) N-bit sequence H which is obtained by performing arithmetic processing Y on N-bit sequence e (sequence e is different from sequence E, sequence F, and sequence f) in the logic circuit is transferred to the memory.

First, N-bit sequence E transferred from the memory 223 is input to the register 221. Then, sequence e is obtained by performing arithmetic processing Y in the logic circuit 222 (process (21)). Sequence e is transferred to the register 225.

Next, N-bit sequence F transferred from the memory 223 is input to the register 221. Then, sequence f obtained by performing arithmetic processing Y in the logic circuit 222 is transferred (process (22)). Sequence e stored in the register 225 at this time needs to be prevented from being overwritten because sequence e is used in subsequent processes. For this purpose, sequence e is transferred to the register 221 or the memory 223.

However, if sequence e is transferred to the register 221, sequence e is overwritten with sequence f in process (23). For this reason, sequence e must be transferred to the memory 223. This means that a step in which sequence e is transferred to the memory 223 is required in process (21) or process (22) or between the processes.

Further, sequence f is transferred to the register 221 through the register 225.

After that, sequence G which is obtained by performing arithmetic processing Y on sequence f input to the register 221 in the logic circuit 222 is transferred to the memory 223 (process (23)).

Lastly, since sequence e obtained in process (21) is stored in the memory 223, N-bit sequence e transferred from the memory 223 is input to the register 221. Sequence H obtained by performing arithmetic processing Y in the logic circuit 222 is transferred to the memory 223 through the register 225 (process (24)).

As described above, although sequence e can be obtained in process (21), sequence e needs to be once transferred to the memory 223 and transferred again from the memory 223 to the register 221 to be used in process (24). To prevent this inconvenience, the capacity of the register 225 is increased; however, a circuit cannot be enlarged unlimitedly in consideration of the circuit design.

Figure 7B:
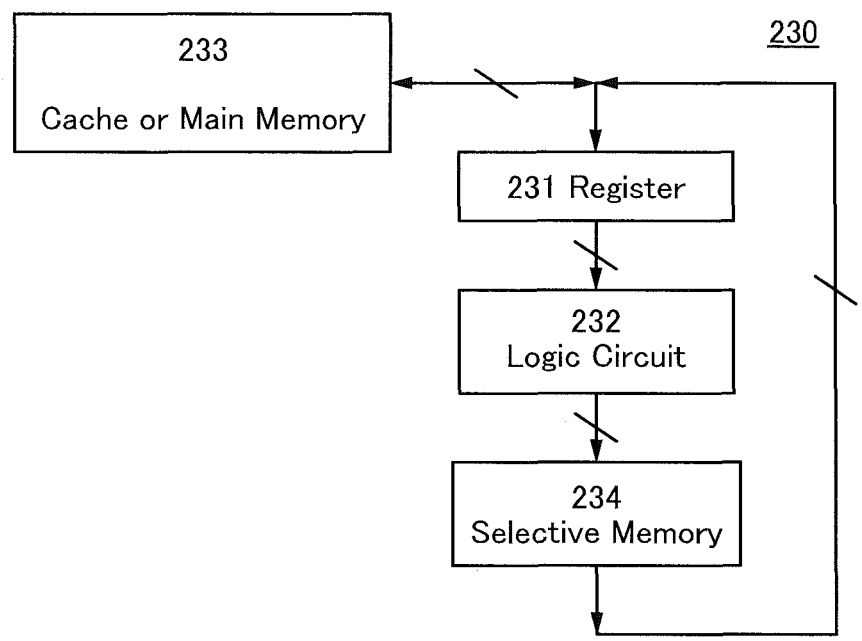

FIG. 7B illustrates part of a data processing device 230 including a selective memory 234. A register 231, a logic circuit 232, a memory 233, and the selective memory 234 in the data processing device 230 are illustrated in FIG. 7B. The memory 233 is a cache memory or a main memory and is provided in a region relatively apart from the register 231 and the logic circuit 232.

The selective memory 234 includes a plurality of selective memory cells described in Embodiment 1. Here, the case where the register 231 is an N-bit register, the selective memory 234 is an N-bit memory, and the above-described processes (21) to (24) are performed in this order is described.

First, N-bit sequence E transferred from the memory 233 is input to the register 231. Then, N-bit sequence e is obtained by performing arithmetic processing Y in the logic circuit 232 (process (21)). At this time, sequence e is stored in the selective memory 234.

Next, N-bit sequence F transferred from the memory 233 is input to the register 231. Then, N-bit sequence f is obtained by performing arithmetic processing Y in the logic circuit 232 and transferred (process (22)). Here, sequence f is transferred to the register 231 without being stored in the selective memory 234. The selective memory 234 keeps storing the sequence obtained in process (21) without rewriting.

Next, sequence f stored in the register 231 is transferred to the logic circuit 232 and then, N-bit sequence G is obtained by performing arithmetic processing Y and transferred to the memory 233 (process (23)). Here, sequence G is transferred without being stored in the selective memory 234.

Lastly, in process (24), sequence e stored in the selective memory 234 is transferred to the register 231 and N-bit sequence H obtained by performing arithmetic processing Y in the logic circuit 232 is transferred to the memory 233 through the selective memory 234.

When the data processing device 220 and the data processing device 230 are compared, sequence e does not need to be transferred to the memory 223 and transferred again from the memory 223 in the data processing device 230 unlike in the case of the data processing device 220, which allows processing time to be reduced and processing to be performed at high speed.

Further, when the data processing device 220 and the data processing device 230 are compared, the register 221, the register 231, and the register 225 are N-bit registers and the selective memory 234, which corresponds to the register 225, is an N-bit memory. However, unlike the selective memory 234, the register 225 does not have a function of selectively storing data or selectively letting data through; thus, the above-described inconvenience is caused.

In other words, the data processing device 230 has at least one effect of reducing processing time, processing at high speed, and achieving high integration of a circuit by reducing the number of bits of a register.

Embodiment 3

In this embodiment, an example of a data processing device in which a shifter (barrel shifter) is used as a logic circuit is described with reference to FIG. 8. The shifter is a logic circuit that can shift an input sequence by a specified number of digits. The shifter is included in a data processing device such as a processor, as similar to an arithmetic unit (ALU).

The larger the number of digits shifted by the shifter is, the more time for processing is needed. However, processing time can be reduced by providing a selective memory in the shifter.

Figure 8:
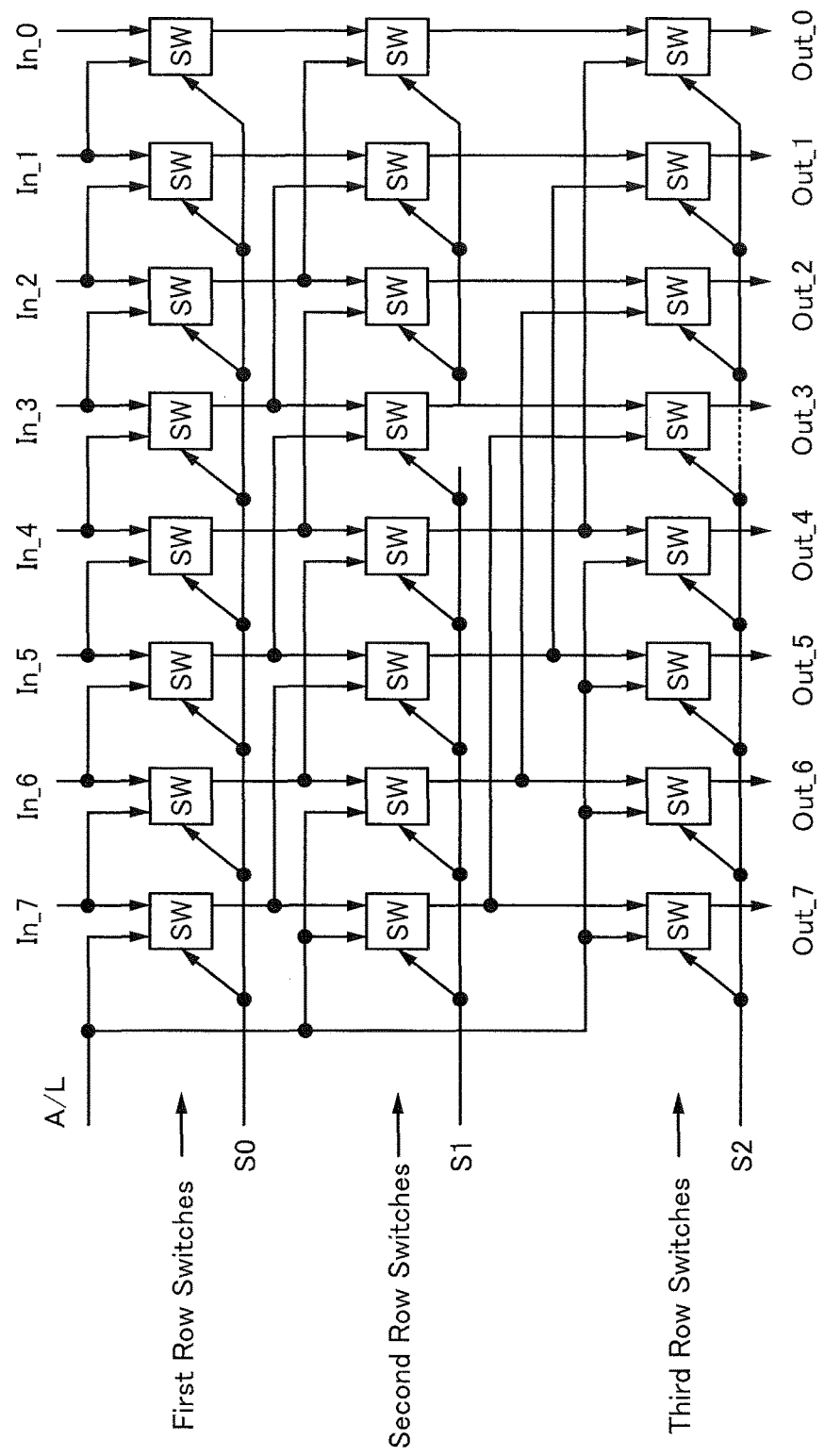
FIG. 8 illustrates an example of a shifter described in Embodiment 3.

FIG. 8 is a circuit diagram of an 8-bit shifter that shifts by 0 to 7 digits to the right. In FIG. 8, SW represents a switch.

To each switch in a first row switch group (first row switches), a signal In_n (note that n is an integer greater than or equal to 0 and less than or equal to 7) and a signal In_n+1 (note that when n is 7, the signal is 0, 1, or In_0 depending on a shift processing method (the signal is represented by A/L (arithmetic shift/logical shift) in drawings)) from a column to the immediate left are input. When a signal S0 for switching switches is "0", each of the switches outputs a signal In_n, and when the signal S0 is "1", each of the switches outputs a signal In_n+1.

This means that when the signal S0 is "0", signals input to the respective columns are output from the first row switches without being shifted. In contrast, when the signal S0 is "1", each of the first row switches outputs a signal input to a column to its immediate left and as a result, input signals are shifted by one column (one digit) to the right and are output.

To each switch in a second row switch group (second row switches), an output of a first row switch in the same column and an output of a first row switch in the second column to the left of the second row switch are input. When a signal S1 is "0", the output of the first row switch in the same column is chosen to be output and when the signal S1 is "1", the output of the first row switch in the second column to the left of the second row switch is chosen to be output. As a result, when the signal S1 is "1", outputs of the first row switches are shifted by two columns (two digits) to the right and are output.

To each switch in a third row switch group (third row switches), an output of a second row switch in the same column and an output of a second row switch in the fourth column to the left of the third row switch are input. The former is output when a signal S2 is "0", and the latter is output when the signal S2 is "1". This means that when the signal S2 is "1", outputs of the second row switches are shifted by four columns (four digits) to the right and are output.

In such a manner, a one-digit shift to the right occurs when S0 is "1", a two-digit shift to the right occurs when S1 is "1", and a four-digit shift to the right occurs when S2 is "1". Thus, by combination of the values of S2, S1, and S0, signals can be shifted by 0 to 7 digits to be output. Specifically, signals can be shifted by (4×S2+2×S1+S0) digits to the right to be output.

Although FIG. 8 illustrates an 8-bit shifter, a 64-bit shifter which can shift by up to 63 columns (63 digits) to the right can be formed, for example. In the 64-bit shifter, 64 or more input columns and fourth to sixth row switches are provided, and each fourth row switch is connected to a third row switch in the $8^{th}$ column to the left of the fourth row switch, each fifth row switch is connected to a fourth row switch in the $16^{th}$ column to the left of the fifth row switch, and each sixth row switch is connected to a fifth row switch in the $32^{nd}$ column to the left of the sixth row switch.

A shifter has a very simple logical structure. However, in the case of a 64-bit shifter, a signal needs to be sent from 32 columns away in the sixth row, which requires a number of long wirings. Thus, an increase in delay time cannot be avoided. However, processing time can be reduced by providing a selective memory or a selective memory cell in the shifter.

Figure 9:
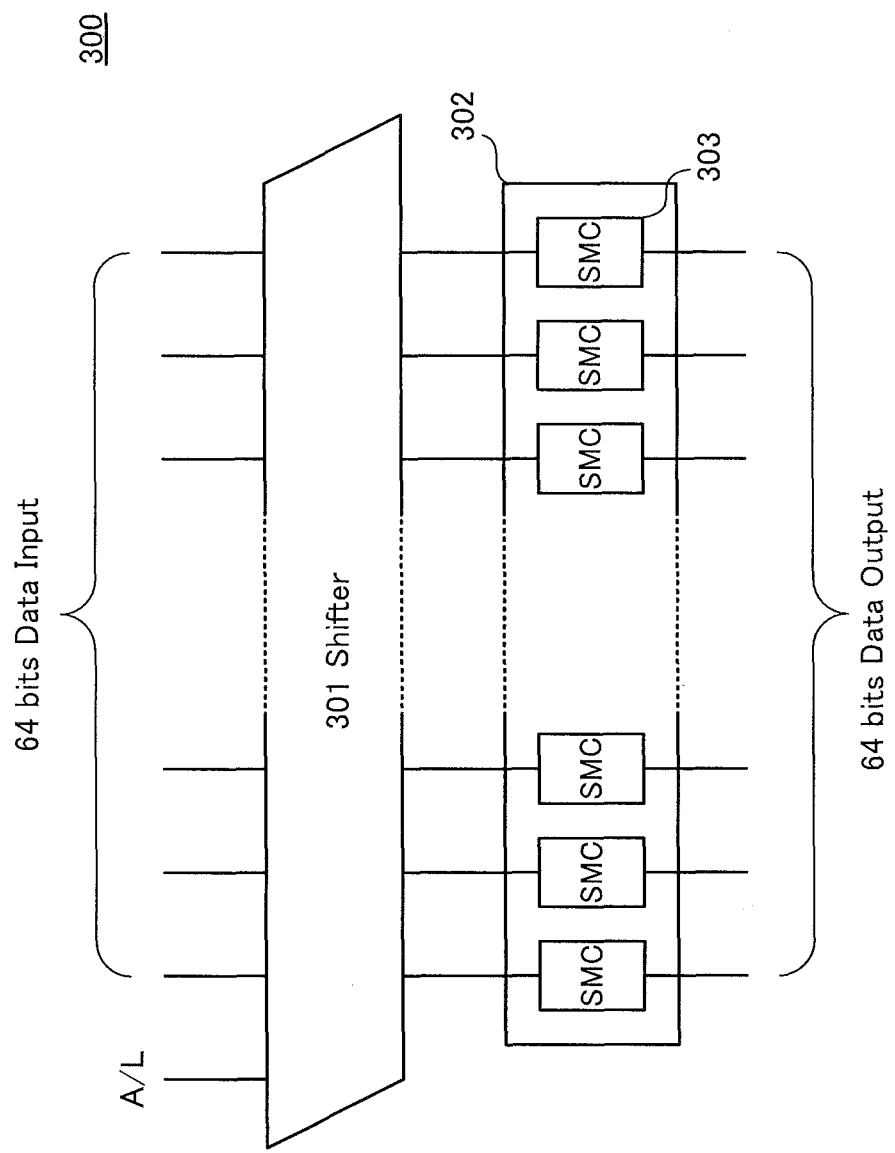
FIG. 9 illustrates an example of a data processing device described in Embodiment 3.

FIG. 9 illustrates part of a data processing device 300 having a configuration in which arithmetic results of a 64-bit shifter 301 are output through a selective memory 302. It is needless to say that the shifter is not limited to a 64-bit shifter and may be a 32-bit shifter or a 128-bit shifter. A shifter with a larger number of bits is more effective in improving arithmetic processing.

The selective memory 302 includes input and output terminals each of which is connected to a selective memory cell (SMC) 303. The numbers of the input terminals and the output terminals each agree with the number of output terminals of the shifter 301. As the selective memory cell 303, the selective memory cell 130, the selective memory cell 140, the selective memory cell 150, the selective memory cell 160, or the selective memory cell 180 described in Embodiment 1 can be used. Alternatively, any kind of selective memory cell that can let through input data, store input data, and output stored data can be used.

Here, the cases where the following processes (31) to (33) are performed in this order in the data processing device 300 and a data processing device including only the shifter 301 are described.
(31) A 64-bit sequence obtained by shifting 64-bit sequence I by 61 digits to the right is output.
(32) A 64-bit sequence obtained by shifting 64-bit sequence J by 2 digits to the right is output.
(33) A 64-bit sequence obtained by shifting 64-bit sequence I by 61 digits to the right is output.

In the data processing device including only the shifter 301, 64-bit sequence I is input to the shifter and a 64-bit sequence obtained by shifting 64-bit sequence I by 61 columns to the right is output (process (31)). Then, 64-bit sequence J is input to the shifter and a 64-bit sequence obtained by shifting 64-bit sequence J by 2 columns to the right is output (process (32)). After that, 64-bit sequence I is input to the shifter and a 64-bit sequence obtained by shifting 64-bit sequence I by 61 columns to the right is output (process (33)).

Processes that are similar to those performed in the data processing device including only the shifter 301 may be performed in the data processing device 300. However, the data processing device 300 can perform the processes more efficiently because the data processing device 300 includes the selective memory 302.

For example, 64-bit sequence I is input to the shifter and a 64-bit sequence obtained by shifting 64-bit sequence I by 61 columns to the right is output (process (31)). At the same time, the 64-bit sequence obtained by shifting 64-bit sequence I by 61 columns to the right is stored in the selective memory 302. Then, 64-bit sequence J is input to the shifter and a 64-bit sequence obtained by shifting 64-bit sequence J by 2 columns to the right is output (process (32)). After that, the 64-bit sequence stored in the selective memory 302 is output (process (33)).

There is no difference in processing speed for processes (31) and (32) between the data processing device 300 and the data processing device including only the shifter 301. However, in process (33), the time it takes for the data processing device 300 to terminate the process of outputting the 64-bit sequence stored in the selective memory 302 is shorter than the time it takes for the data processing device including only the shifter 301 to terminate the process of shifting the 64-bit sequence by 61 columns to the right.

In addition, in the case of performing process (33) using the data processing device including only the shifter 301, it requires time to transfer sequence I to the shifter 301 composed of a register, a cache memory, a main memory, or the like (see Embodiment 2). Because such an operation is unnecessary in the data processing device 300, processes can be performed at higher speed.

This application is based on Japanese Patent Application serial no. 2013-051642 filed with Japan Patent Office on Mar. 14, 2013, the entire contents of which are hereby incorporated by reference.

What is claimed is:

1. A data processing device comprising:
   an input terminal and an output terminal;
   a first switch comprising a first terminal electrically connected to the input terminal, and a second terminal electrically connected to the output terminal;
   a second switch comprising a third terminal electrically connected to the input terminal, and a fourth terminal;
   a third switch comprising a fifth terminal electrically connected to the second terminal, and a sixth terminal; and a signal storing circuit electrically connected to the fourth terminal and the sixth terminal, wherein:

the data processing device is configured to select at least a first operation, a second operation, and a third operation, the first operation comprises the steps of outputting a data input from the input terminal to the output terminal, and storing the data in the signal storing circuit, the second operation comprises the step of outputting a data input from the input terminal to the output terminal without storing the data in the signal storing circuit, and the third operation comprises the step of outputting a data stored in the signal storing circuit to the output terminal.

2. The data processing device according to claim 1, further comprising:

a memory; and a logic circuit configured to perform an arithmetic processing on a data, wherein after the arithmetic processing, the data is transferred from the memory and input to the first switch.

3. The data processing device according to claim 2, wherein:

when a plurality of processes are performed in the data processing device, the data processing device is configured to perform at least a first processing, a second processing, and a third processing, the first processing comprises the step of selecting a most frequently performed process from the plurality of processes, the second processing comprises the step of storing a result of the most frequently performed process in the signal storing circuit when the most frequently performed process is performed for the first time, and the third processing comprises the step of outputting the result stored in the signal storing circuit when the most frequently performed process is performed for the second time.

4. The data processing device according to claim 3, wherein:

the data processing device is configured to further perform a fourth processing, the fourth processing comprises the step of performing a process different from the most frequently performed process, and the fourth processing is performed between the second processing and the third processing.

5. The data processing device according to claim 1, wherein each of the first switch, the second switch, and the third switch is a transistor, a transfer gate, a transmission gate, a three-state buffer, or a three-state inverter.

6. The data processing device according to claim 1, wherein the signal storing circuit is a capacitor or a latch circuit.

7. The data processing device according to claim 2, wherein the logic circuit is a shifter.

* * * * *